US012757647B2

(12) United States Patent
Khazaka

(10) Patent No.: US 12,757,647 B2
(45) Date of Patent: Oct. 6, 2026

(54) METHOD OF SELECTIVELY FORMING CRYSTALLINE BORON-DOPED SILICON GERMANIUM ON A SURFACE

(71) Applicant: ASM IP Holding, B.V., Almere (NL)

(72) Inventor: Rami Khazaka, Leuven (BE)

(73) Assignee: ASM IP HOLDING B.V., Almere (NL)

( * ) Notice: Subject to any disclaimer, the term of this patent is extended or adjusted under 35 U.S.C. 154(b) by 431 days.

(21) Appl. No.: 18/304,125

(22) Filed: Apr. 20, 2023

(65) Prior Publication Data

US 2023/0352301 A1 Nov. 2, 2023

Related U.S. Application Data

(60) Provisional application No. 63/335,842, filed on Apr. 28, 2022.

(51) Int. Cl.
*H10P 14/20* (2026.01)
*C30B 25/18* (2006.01)
(Continued)

(52) U.S. Cl.
CPC .......... *H10P 14/3411* (2026.01); *C30B 25/18* (2013.01); *C30B 29/52* (2013.01); *C30B 31/06* (2013.01); *C30B 33/08* (2013.01); *H10D 30/014* (2025.01); *H10D 30/6735* (2025.01); *H10D 30/675* (2025.01); *H10D 62/119* (2025.01); *H10D 62/151* (2025.01); *H10P 14/24* (2026.01); *H10P 14/2926* (2026.01); *H10P 14/3454* (2026.01); *H10P 50/242* (2026.01)

(58) Field of Classification Search
CPC ......... H01L 21/02532; H01L 21/02433; H01L 21/02592; H01L 21/0262; H01L 21/3065; H01L 21/0243; H01L 21/02381; H01L 21/0245; H01L 21/02579; H01L 21/02639; H01L 21/0257; H01L 21/02636; H01L 21/02664; H01L 21/30604; C30B 25/18; C30B 29/52; C30B 31/06; C30B 33/08; C30B 25/04; C30B 25/16; C30B 25/22; C30B 33/12; H10D 30/014; H10D 30/6735; H10D 30/675; H10D 62/119; H10D 62/151; H10D 30/43; H10D 30/62; H10D 30/6757; H10D 62/822; H10D 62/121; H10D 62/405; H10D 30/021; H10D 30/60; B82Y 10/00; H10P 14/3411; H10P 14/24; H10P 14/2926; H10P 14/3454; H10P 50/242; H10P 14/2905; H10P 14/3211; H10P 14/3444; H10P 14/2925; H10P 14/271; H10P 14/27; H10P 14/3438; H10P 14/38; H10P 50/642
See application file for complete search history.

(56) References Cited

U.S. PATENT DOCUMENTS

| | | | | |
|---|---|---|---|---|
| 2011/0117732 A1* | 5/2011 | Bauer | H01L 21/02639 438/507 |
| 2012/0295427 A1* | 11/2012 | Bauer | H10D 62/021 438/494 |
| 2023/0307506 A1* | 9/2023 | Breil | H01L 21/02491 |

* cited by examiner

*Primary Examiner* — Julia Slutsker
(74) *Attorney, Agent, or Firm* — Banner & Witcoff, Ltd.

(57) ABSTRACT

Methods and systems for selectively forming crystalline boron-doped silicon germanium on a surface of a substrate. The methods can be used to selectively form the boron-doped silicon germanium within a gap from the bottom upward. Exemplary methods can be used to, for example, form source and/or drain regions in field effect transistor devices, such as in gate-all-around field effect transistor devices.

21 Claims, 11 Drawing Sheets

(51) Int. Cl.

| | |
|---|---|
| ***C30B 29/52*** | (2006.01) |
| ***C30B 31/06*** | (2006.01) |
| ***C30B 33/08*** | (2006.01) |
| ***H10D 30/01*** | (2025.01) |
| ***H10D 30/67*** | (2025.01) |
| ***H10D 62/10*** | (2025.01) |
| ***H10D 62/13*** | (2025.01) |
| ***H10P 14/24*** | (2026.01) |
| ***H10P 50/24*** | (2026.01) |

METHOD OF SELECTIVELY FORMING CRYSTALLINE BORON-DOPED SILICON GERMANIUM ON A SURFACE

CROSS REFERENCE TO RELATED APPLICATIONS

This Application claims the benefit of U.S. Provisional Application 63/335,842 filed on Apr. 28, 2022, the entire contents of which are incorporated herein by reference in their entirety.

FIELD OF THE INVENTION

The present disclosure generally relates to methods and systems suitable for forming electronic devices. More particularly, the disclosure relates to methods and systems that can be used for selectively depositing boron-doped epitaxial silicon germanium on a surface of a substrate.

BACKGROUND OF THE DISCLOSURE

The scaling of semiconductor devices, such as, for example, complementary metal-oxide-semiconductor (CMOS) devices, has led to significant improvements in speed and density of integrated circuits. Recently, for example, multi-gate and three-dimensional field effect transistors (FETs), such as FinFETs and gate-all-around FETs have been developed to further scale semiconductor devices. However, device scaling for such devices faces significant challenges.

One particular challenge relates to the manufacture of defect-free active regions, such as source and drain regions of three-dimensional structures suitable for FinFETs, gate-all-around FETs, and the like. In such applications, it may be desirable to selectively form relatively high conductivity semiconductor material (e.g., doped crystalline Group IV or other semiconductor material). In particular, it may be desirable to selectively epitaxially grow monocrystalline doped semiconductor material on a surface for such applications. Such material may be particularly desirable to impart desired stress on channel regions of devices. However, suitable techniques that can be performed at relatively low temperatures and that can form the source and drain regions with relatively few defects may not be well developed. Accordingly, improved methods and systems for selectively and epitaxially forming doped semiconductor material are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to deposition methods, and more particularly, to selective epitaxial deposition methods. Embodiments of the disclosure also relate to structures and devices formed using such methods, and to apparatus for performing the methods and/or for forming the structure and/or devices. While the ways in which various embodiments of the present disclosure address drawbacks of prior methods and systems are discussed in more detail below, in general, various embodiments of the disclosure provide improved methods of selectively and epitaxially forming doped semiconductor layers on a first surface relative to a second surface. The doped semiconductor layers may be suitable as source and/or drain regions in field effect transistors, such as FinFETs, gate-all-around metal oxide semiconductor field effect transistors, nanosheet metal oxide semiconductor field effect transistors, nanowire metal oxide semiconductor field effect transistors, complementary metal oxide semiconductor field effect transistors, and the like.

In accordance with at least one embodiment of the disclosure, a method of forming crystalline boron-doped (B-doped) silicon germanium on a surface of a substrate is provided. An exemplary method includes providing a substrate within a reaction chamber and performing a cyclical deposition process to selectively form boron-doped silicon germanium epitaxial material overlying a first surface, relative to a second surface of the substrate. The first surface can include a first crystallographic orientation and the second surface can include a second crystallographic orientation, which is different from the first crystallographic orientation. The first surface and the second surface can be or include the same material. The cyclical deposition process can include one or more deposition cycles. Each deposition cycle can include selectively forming boron-doped epitaxial silicon germanium overlying the first surface and (e.g., selectively) etching boron-doped silicon germanium overlying the second surface. In accordance with examples of these embodiments, the first surface comprises or consists of a Si{100} crystal facet. In accordance with further examples, the second surface comprises one or more of a Si{110} crystal facet and a higher order silicon crystal facet that is perpendicularly oriented to a Si{100} crystal facet. In accordance with additional examples, the substrate comprises a feature. The feature can include a bottom comprising the first surface and a sidewall surface comprising the second surface. In accordance with yet further examples, a temperature within the reaction chamber during one or more steps is less than 500° C. or between about 280° C. and about 450° C. or between about 350° C. and about 425° C. In accordance with examples of the disclosure, the method comprises forming boron-doped non-epitaxial silicon germanium overlying the second surface. In some cases, the step of selectively forming boron-doped epitaxial silicon germanium comprises providing first silicon precursor comprising a silane (e.g., having a formula $Si_nH_{2n+2}$) and a second silicon precursor comprising halogenated silane (e.g., where one or more hydrogen atoms of a silane are independently replaced with a halogen) to the reaction chamber. In the latter case, crystalline (e.g., monocrystalline) boron-doped silicon germanium may form on the second surface, but a growth rate of such material on the second surface is much lower than a growth rate of the material on the first surface. In other cases, the boron-doped silicon germanium overlying the second surface can be non-epitaxial—e.g., non-monocrystalline, such as polycrystalline or amorphous silicon germanium. In accordance with further examples, the step of etching comprises providing an etchant. This step can further include providing a carrier gas. In such cases, an etchant flowrate can be between 10 and 200 sccm; preferably between 20 and 50 sccm. A carrier gas flowrate can be between 5 to 15 slm; preferably about 10 slm. In some cases, a flowrate ratio of a flowrate of the carrier gas and a flowrate of the etchant is between about 25:1 and about 1500:1 or between about 50:1 and about 750:1. The boron-doped silicon germanium overlying the second surface can be removed during each deposition cycle. As set forth in more detail below, methods as described herein can be used to fill a feature, such as a gap, with doped monocrystalline epitaxial material from the bottom of the feature upwards.

In accordance with further embodiments of the disclosure, a method of forming a gate-all-around device is provided. The method can include forming a source and/or drain region using a method of selectively forming crystalline boron-doped silicon germanium on a surface as described herein.

In accordance with yet further examples of the disclosure, a field effect transistor device includes one or more of a source region or a drain region formed according to the method described herein.

Further described is a system comprising a reaction chamber, a gas injection system, and a controller configured for causing the system to perform a method according to the present disclosure.

These and other embodiments will become readily apparent to those skilled in the art from the following detailed description of certain embodiments having reference to the attached figures. The invention is not being limited to any particular embodiments disclosed.

BRIEF DESCRIPTION OF THE FIGURES

A more complete understanding of the embodiments of the present disclosure may be derived by referring to the detailed description and claims when considered in connection with the following illustrative figures.

Figure 1:
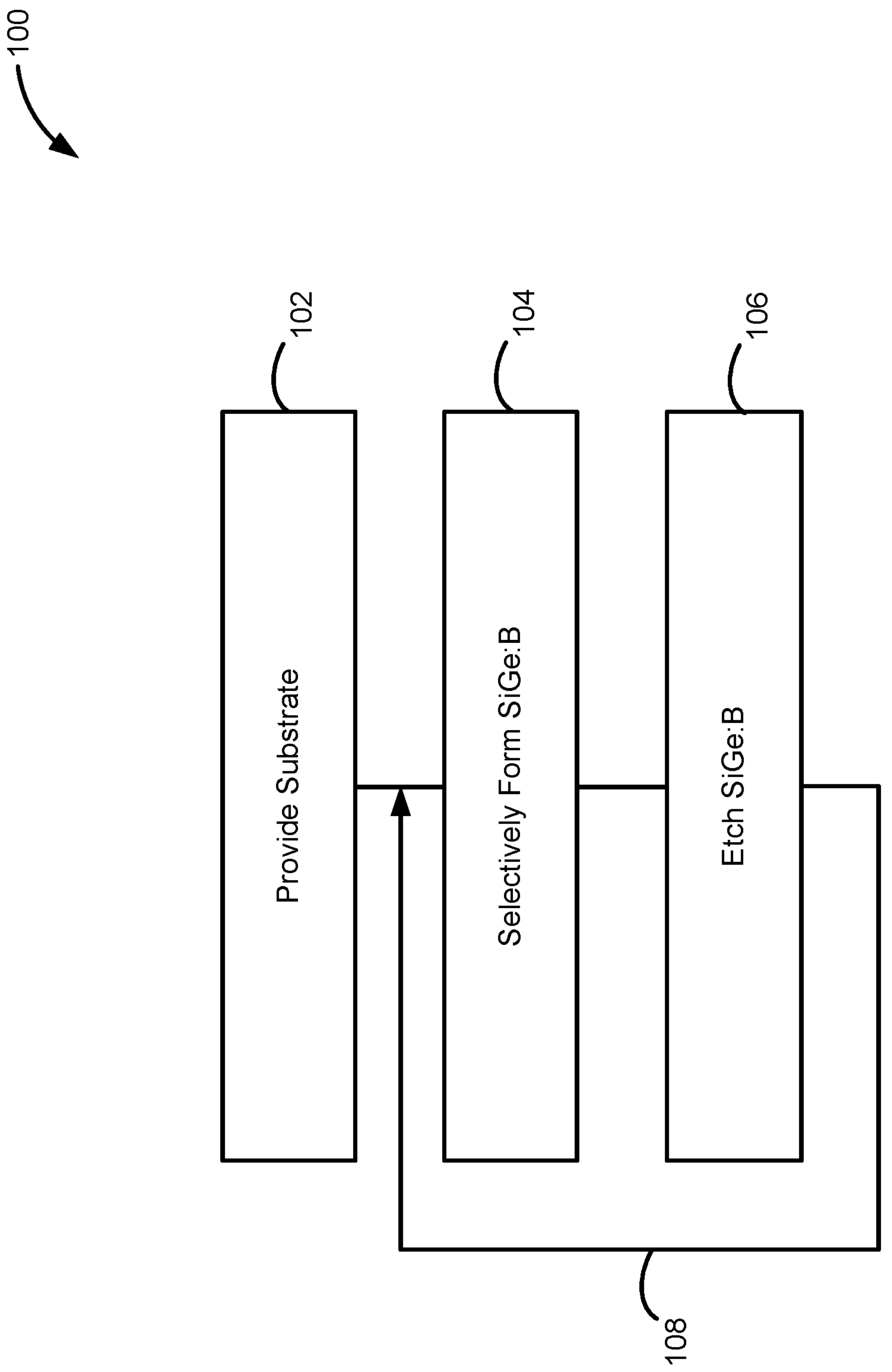
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices, and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments; unless otherwise noted, the exemplary embodiments or components thereof may be combined or may be applied separate from each other.

As set forth in more detail below, various embodiments of the disclosure provide methods of selectively forming crystalline boron-doped silicon germanium on a surface of a substrate. Exemplary methods can be used to, for example, form (e.g., stressor) source and/or drain regions of semiconductor devices that exhibit relatively high mobility, relatively low resistivity, relatively low contact resistance, and/or that maintain the structure and composition of the deposited layers. For example, the layers can be used as (e.g., stressor) source and/or drain regions in metal oxide field effect transistors (MOSFETs). Exemplary MOSFETs in which these layers can be used include FinFETs and GAA (gate-all-around) FETs or devices.

As used herein, the term "gate-all-around device" may refer to devices that include a conductive material wrapped around a semiconductor channel region. As used herein, the term "gate-all-around device" may also refer to a variety of device architectures, such as nanosheet devices, forksheet devices, vertical FETs, and the like.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a noble gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. As set forth in more detail below, a substrate can include two or more surfaces. In some cases, the surfaces include the same material and differing crystalline facets or orientations.

As used herein, the term "epitaxial layer" can refer to a single crystalline or monocrystalline layer upon an underlying single crystalline substrate or layer, the two single crystalline layers having the same crystal orientation.

As used herein, the term "chemical vapor deposition" can refer to any process wherein a substrate is exposed to one or more volatile precursors, which react and/or decompose on a substrate surface to produce a desired deposition.

As used herein, the term "film" and/or "layer" can refer to any continuous or non-continuous structures and material, such as material deposited by the methods disclosed herein. For example, a film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. It shall be understood that when a composition, method, device, or the like is said to comprise certain features, it means that it includes those features, and that it does not necessarily exclude the presence of other features, as long as they do not render the claim unworkable. This notwithstanding, the wording "comprises" includes the meaning of "consists of," i.e., the case when the composition, method, device, etc. in question only includes the features, components, and/or steps that are listed, and does not contain any other features, components, steps, etc. In accordance with further aspects, substantially the same can mean within ±5%, ±1%, ±0.5%—e.g., atomic, volume, length, or the like, depending on the context.

In this disclosure, any defined meanings do not necessarily exclude ordinary and customary meanings in some embodiments.

The term "carrier gas" as used herein may refer to a gas that is provided to a reaction chamber together with one or more precursors and/or etchants. For example, a carrier gas may be provided to the reaction chamber together with one or more of the precursors and/or etchants used herein. Exemplary carrier gases include $N_2$, $H_2$, and noble gases such as He, Ne, Kr, Ar and Xe. By way of particular examples, the carrier gas can include one or more of nitrogen (N2), argon (Ar), helium (He), in any combination.

As opposed to a carrier gas, a purge gas may be provided to a reaction chamber separately, i.e., not together with one or more precursors. This notwithstanding, gases which are commonly used as a carrier gas may also be used as a purge gas, even within the same process. For example, in a cyclic deposition-etch process, $N_2$ used as a carrier gas may be provided together with one or more precursors during deposition pulses, and $N_2$ used as a purge gas may be used to separate deposition and etch pulses. Of course, $N_2$ may be replaced by another suitable inert gas, such as $H_2$, or a noble gas, such as He, Ne, Kr, Ar, and Xe. Hence, it is the manner of how a gas is provided to the reaction chamber that determines whether a gas serves as a purge gas or a carrier gas in a specific context. Thus, as used herein, the term "purge" may refer to a procedure in which an inert or substantially inert gas is provided to a reaction chamber in between two pulses of gases that may react with each other. For example, a purge, e.g., using nitrogen gas, may be provided between a precursor pulse and an etchant pulse, thus avoiding or at least minimizing gas phase reactions between the precursor and the etchant. It shall be understood that a purge can be affected either in time or in space, or both. For example, in the case of temporal purges, a purge step can be used, e.g., in the temporal sequence of providing a first precursor to a reaction chamber, providing a purge gas to the reaction chamber, and providing an etchant to the reaction chamber, wherein the substrate on which a layer is deposited does not move. In the case of spatial purges, a purge step can take, for example, the following form: moving a substrate from a first location to which a first precursor is (e.g., continually) supplied, through a purge gas curtain, to a second location to which a second precursor or etchant is (e.g., continually) supplied.

As set forth in more detail below, various steps of exemplary methods described herein can be performed in the same reaction chamber or in different reaction chambers of, for example, the same cluster tool.

Turning now to the figures, FIG. 1 illustrates a method 100 of selectively forming crystalline boron-doped silicon germanium on a surface of a substrate. Method 100 includes the steps of providing a substrate within a reaction chamber 102 and performing a cyclical deposition process (steps 104 and 106/loop 108) to selectively form boron-doped silicon germanium epitaxial material overlying the first surface, relative to the second surface. As illustrated, cyclical deposition process 108 includes one or more deposition cycles, wherein each deposition cycle includes selectively forming boron-doped epitaxial silicon germanium overlying the first surface (step 104) and etching boron-doped silicon germanium overlying the second surface (step 106).

Figure 4:
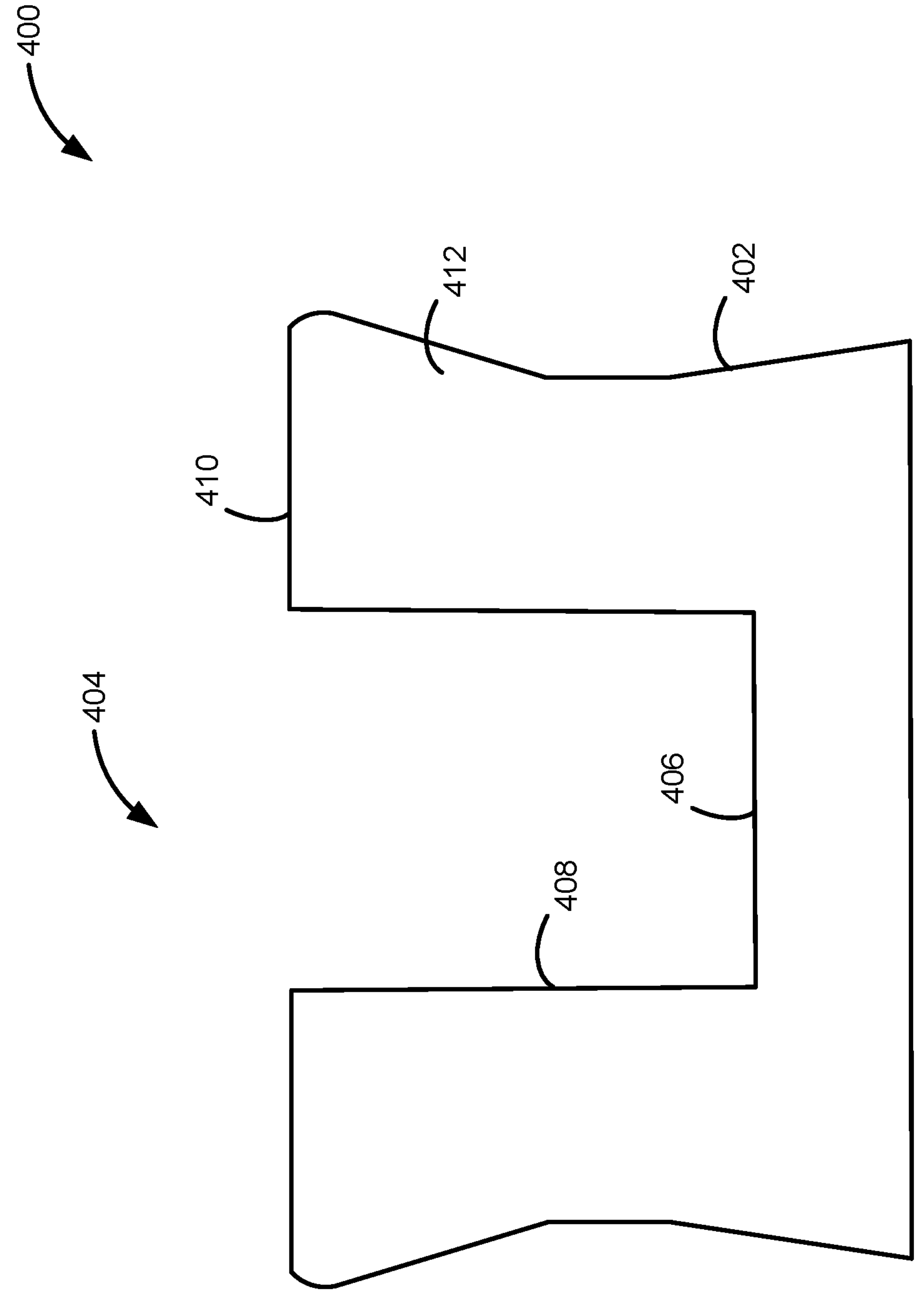
FIGS. 4-9 illustrate structures in accordance with exemplary embodiments of the disclosure.

FIG. 4 illustrates a substrate 400 suitable for use with step 102. Substrate 400 includes bulk material or layer 412 and a feature 404 formed therein (as illustrated) or thereon. In accordance with various examples of the disclosure, bulk material 412 is or includes monocrystalline semiconductor material.

Feature 404 can be in the form of a recess. A recess formed within a substrate or between adjacent protruding structures and any other recess pattern may be referred to as a "gap." That is, a gap may refer to any recess pattern, including a hole/via, trench, region between lines, and the like. A gap can have, in some embodiments, a width of about 20 nm to about 100 nm or about 30 nm to about 50 nm. When a gap has a length that is substantially the same as its width, the gap can be referred to as a hole or a via. Holes or vias typically have a width of about 20 nm to about 100 nm. In some embodiments, an aspect ratio of a feature is greater than 1 or greater than 0.6 or greater than 0.7 or between 0.3 and 1 or between 0.5 and 0.7. The dimensions of the feature may vary depending on process conditions, film composition, intended application, and the like.

In the example illustrated in FIG. 4, feature 404 includes a bottom comprising a first surface 406 and a sidewall comprising a second surface 408. In accordance with examples of the disclosure, first surface 406 includes a first crystallographic orientation and second surface 408 comprises a second crystallographic orientation different than the first crystallographic orientation. In this context, crystalline orientation can be defined using Miller indices. In other words, a Miller index can be used to define a crystallographic orientation (e.g., by defining a crystalline plane or facet) of the first and/or the second surface. In such cases, differing crystallographic orientations comprise differing (e.g., non-equivalent) Miller indices. For example, in some cases, first surface 406 can include or consist of a Si{100} crystal facet and second surface 408 can comprise or consist of one or more non-Si{100} facets, such as a Si{110} crystal facet and a higher order silicon crystal facet that is perpendicularly oriented to a Si{100} crystal facet. Examples of higher order (e.g., silicon) crystal facets that are perpendicular to Si{100} include Si{120}, Si{230}, Si{130}, Si{140}, Si{240}, and Si{340}. In some cases, planes or facets noted herein include the true planes, or true planes ±3 degrees, ±2 degrees, or ±1 degree.

In accordance with further examples of the disclosure, first surface 406 and second surface 408 can be or comprise the same material (e.g., monocrystalline semiconductor material, such as silicon or the like). Substrate 402 can also include a top surface 410, which can comprise the first crystallographic orientation. In some cases, another material can be deposited overlying surface 410 or top surface 410 may include other material.

Returning now to FIG. 1, during step 102, the reaction chamber can be brought to a desired pressure and/or temperature suitable for step 104. By way of examples, a temperature of the reaction chamber or a susceptor therein can be less than 500° C. or between about 280° C. and about 450° C. or between about 350° C. and about 425° C. A pressure within the reaction chamber can be less than 90 Torr or between about 5 Torr and about 90 Torr or between about 10 Torr and about 40 Torr.

Figure 2:
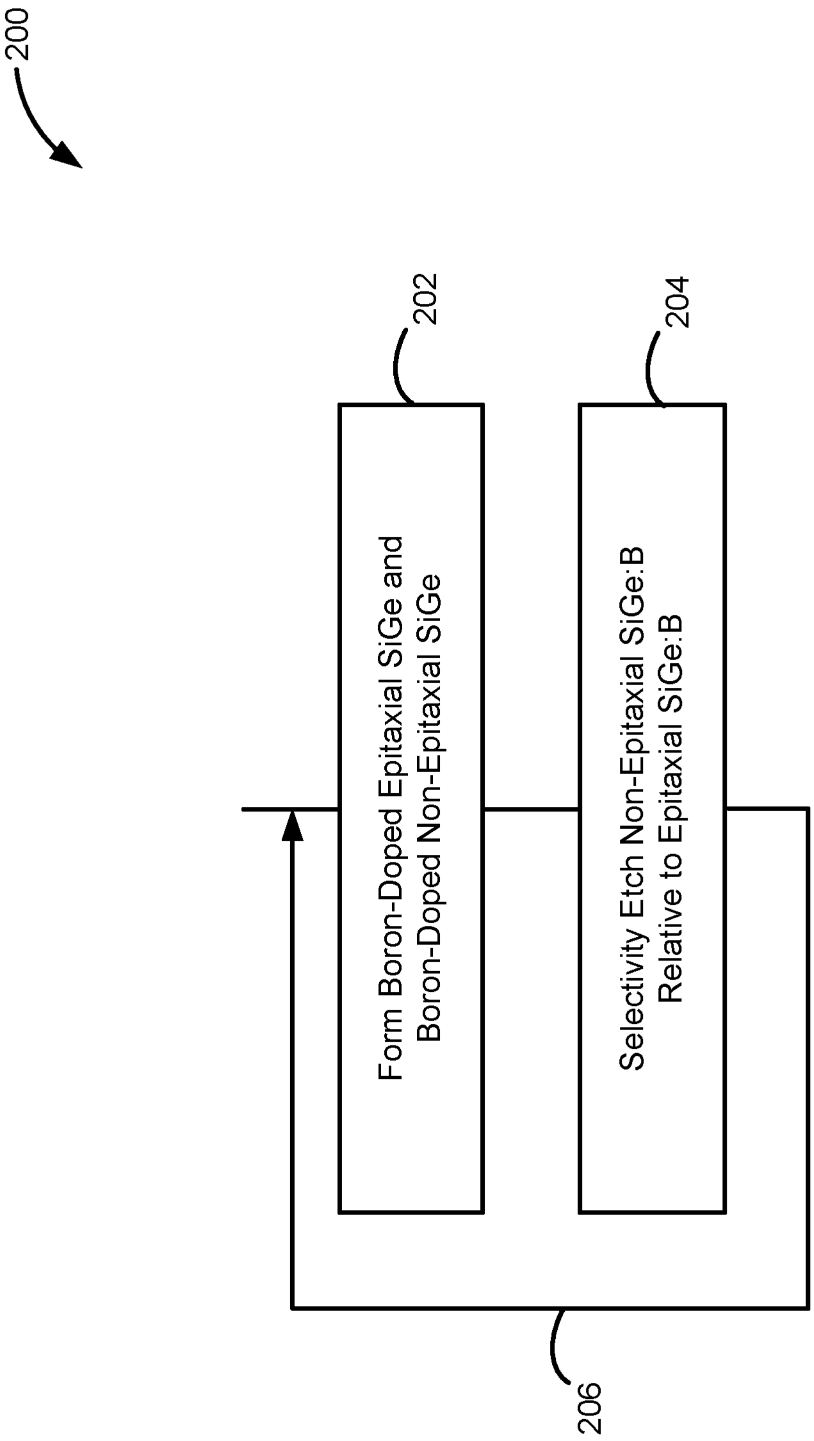
FIG. 2 illustrates an exemplary process in accordance with examples of the disclosure.
Figure 3:
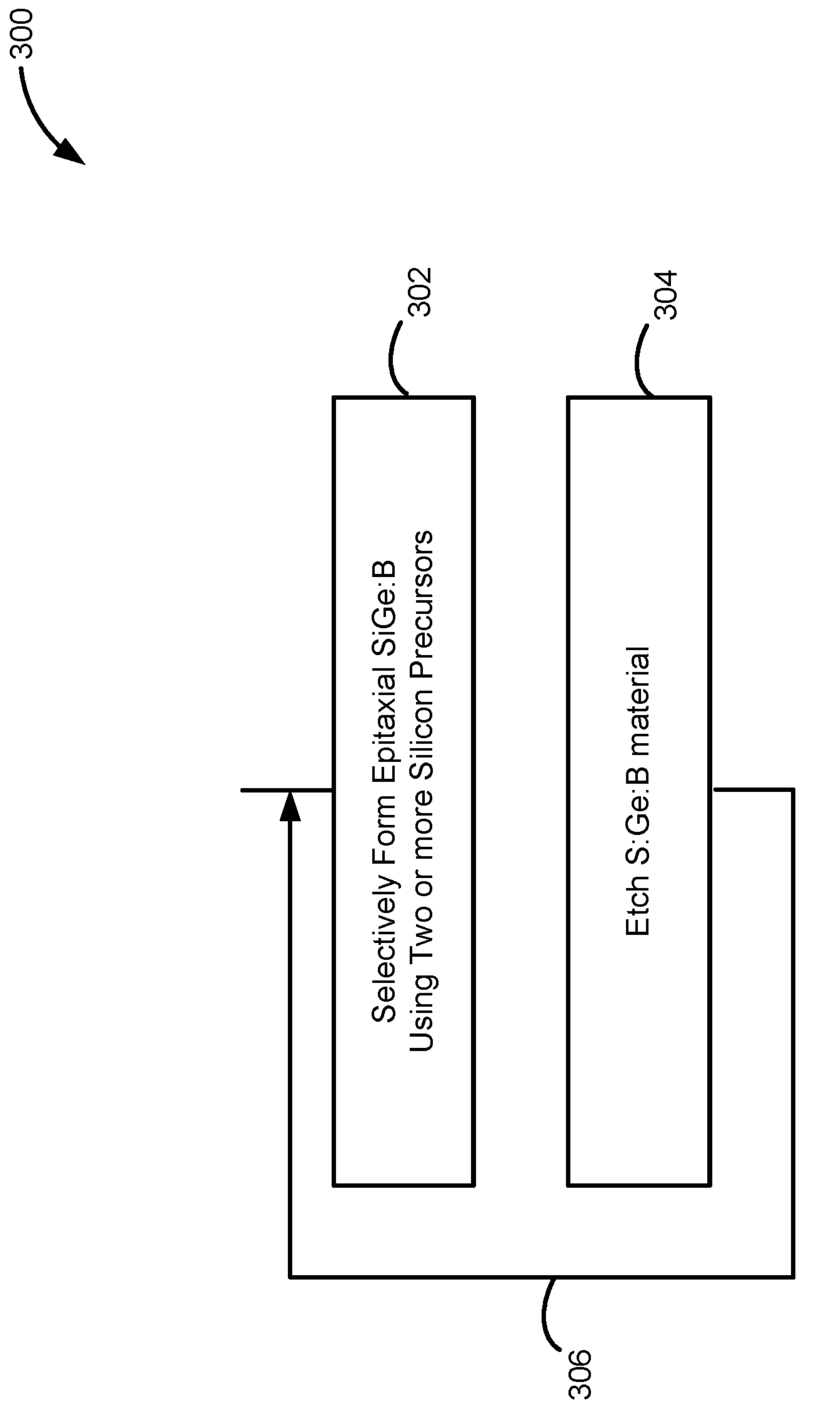
FIG. 3 illustrates another exemplary process in accordance with examples of the disclosure.

Steps 104 and 106 may be performed in a variety of ways. FIG. 2 and FIG. 3 illustrate exemplary processes 200 and 300 suitable for steps 104 and 106 of method 100.

Process 200 includes the steps of forming boron-doped epitaxial silicon germanium and boron-doped non-epitaxial silicon germanium (step 202) and selectively etching boron-doped non-epitaxial silicon germanium (step 204).

Figure 5:
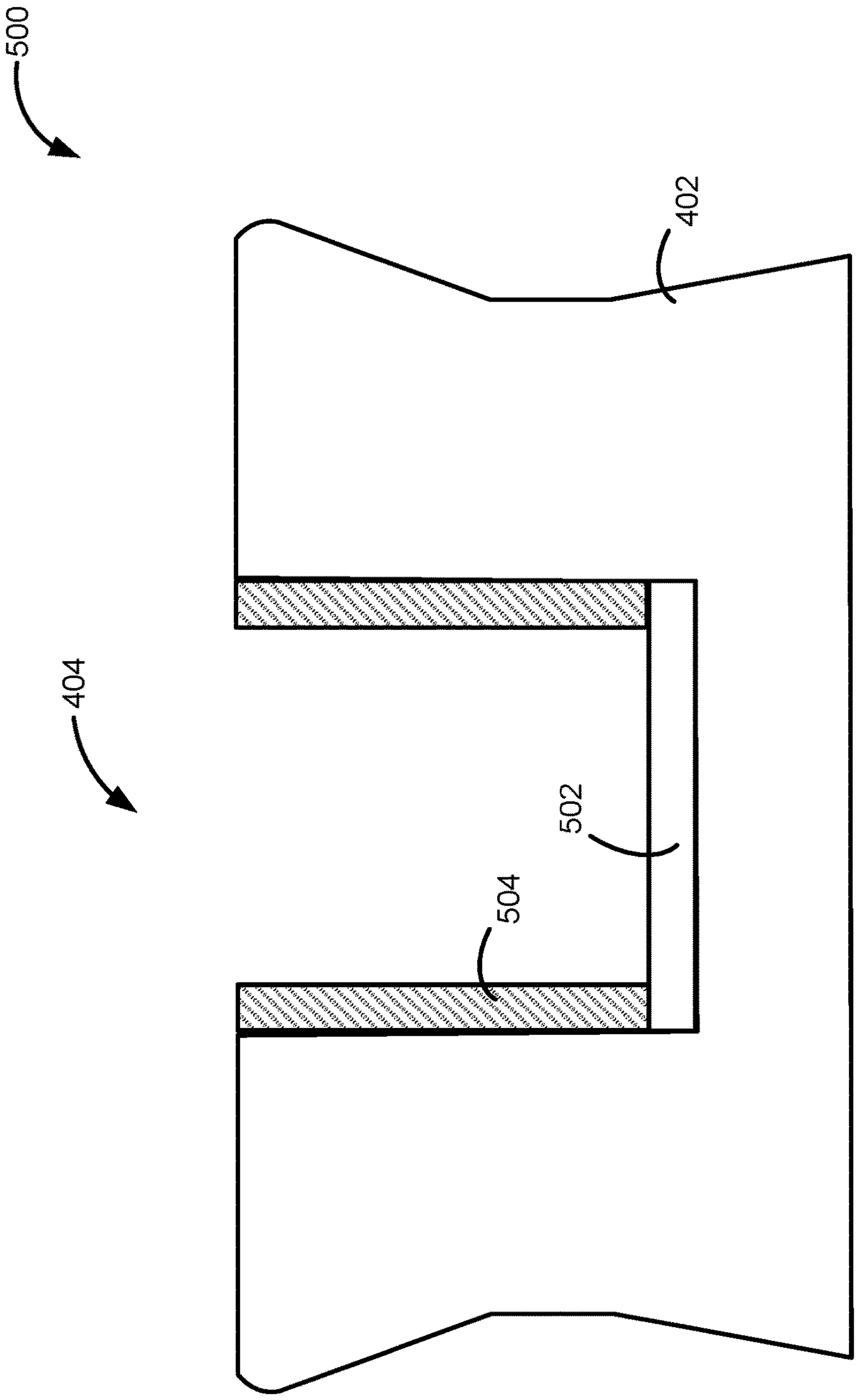

With reference to FIG. 2, FIG. 4, and FIG. 5, during step 202, boron-doped epitaxial material 502 is formed overlying first surface 406 and boron-doped non-epitaxial silicon germanium 504 is formed overlying second surface 408. As used herein, non-epitaxial material can include amorphous and/or polycrystalline material. Although deposition on top surface 410 is not illustrated, in some cases, material may be deposited onto top surface 410 and removed—e.g., using a suitable etch process.

Step 202 can be performed by providing a silicon precursor, a germanium precursor and a boron precursor to the reaction chamber. The silicon precursor can be or include, for example, a silane, such as silane or disilane. The germanium precursor can be or include a germane, such as germane or a higher order germane. The boron precursor can be or include, for example, a boron-containing precursor, such as a borane, such as diborane ($B_2H_6$). The flowrates of the silicon precursor, the germanium precursor, and the boron precursor can be or include typical flowrates to deposit epitaxial material. For example, a flowrate of a boron precursor during the step of selectively forming boron-doped epitaxial silicon germanium overlying the first surface is less than 100 sccm, less than 50 sccm or between about 15 sccm and about 25 sccm. In some cases, a concentration of boron in the B-doped epitaxial silicon germanium is between about $5\times10^{20}$ $cm^{-3}$ and about $5\times10^{21}$ $cm^{-3}$ or between about $1\times10^{21}$ $cm^{-3}$ and about $4\times10^{21}$ $cm^{-3}$.

As illustrated in FIG. 5, during step 202, B-doped epitaxial material 502 forms overlying (e.g., in direct contact with) the first surface 406, and during the same step, because surface 408 has a different crystalline orientation, B-doped non-epitaxial material 504 forms overlying (e.g., in direct contact with) second surface 408. A thickness of B-doped epitaxial material 502 and/or B-doped non-epitaxial material 504 formed during each cycle during step 206/108 can be about 1 nm to about 10 nm or about 2 nm to about 5 nm.

Figure 6:
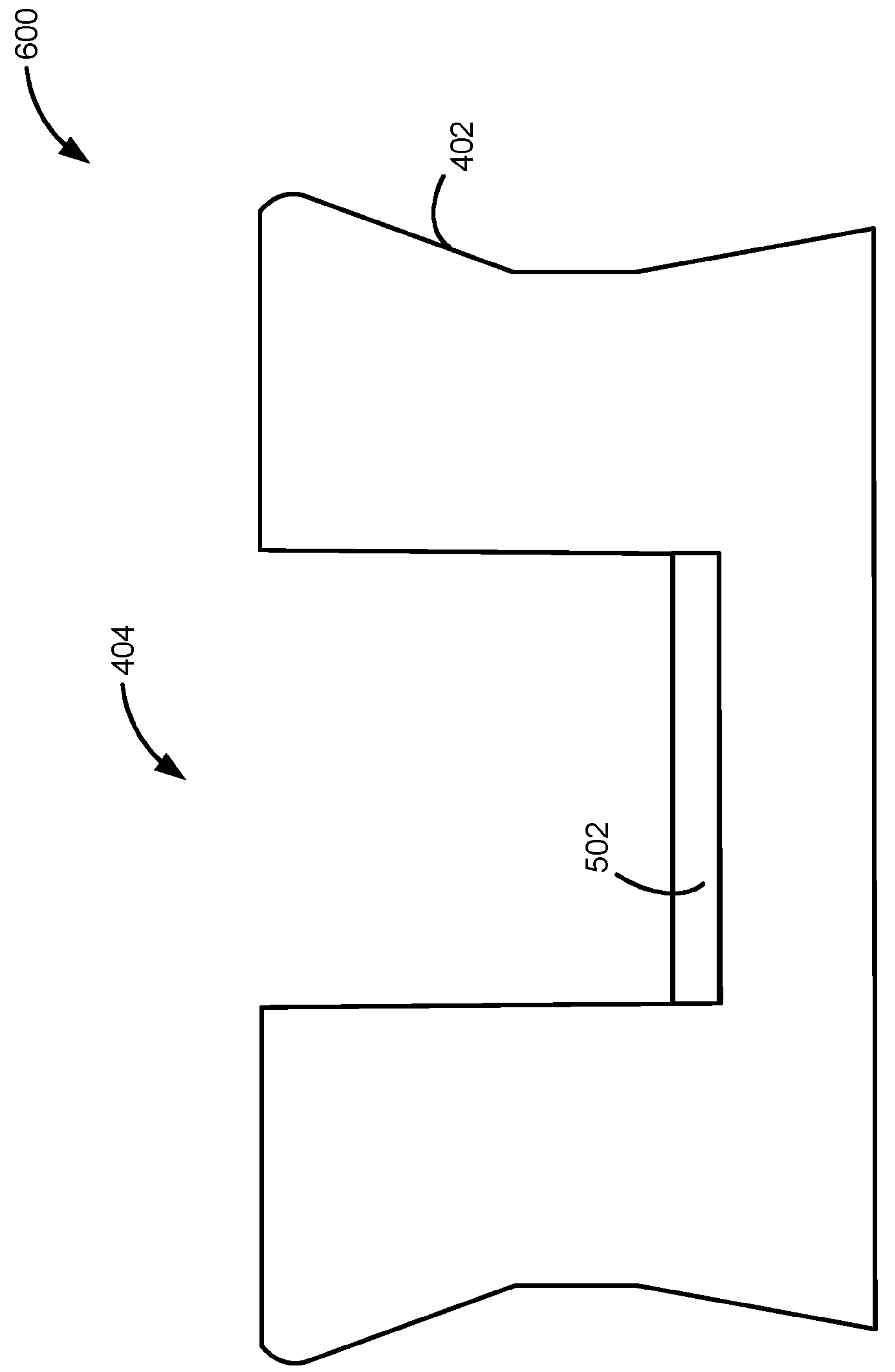

During step 204/106, boron-doped silicon germanium overlying second surface 408 is selectively etched relative to boron-doped epitaxial silicon germanium 502 overlying first surface 406. In some cases, boron-doped non-epitaxial silicon germanium 504 overlying second surface 408 is removed during each deposition cycle 206/108. FIG. 6 illustrates a structure 600, which is formed after a first deposition cycle after boron-doped non-epitaxial silicon germanium 504 overlying second surface 408 is removed.

In accordance with examples of the disclosure, a pressure within the reaction chamber during step 204 can be between about 5 Torr and about 90 Torr or about 10 Torr and about 40 Torr. A temperature within the reaction chamber can be the same or similar to the temperature noted above in connection with step 102.

An etchant used during step 204 can include any suitable etchant that selectively etches boron-doped non-epitaxial silicon germanium relative to boron-doped epitaxial silicon germanium. By way of examples, the etchant can be or include a halogen, such as chlorine. By way of particular examples, the etchant can be or include chlorine ($Cl_2$), Bromine ($Br_2$), HBr, or the like.

In some cases, step 204 can further include providing a carrier gas, which can act as a diluent. The carrier gas can include any combination of carrier gases, such as carrier gases noted herein. By way of example, the carrier can include nitrogen ($N_2$). A (e.g., volumetric) flowrate ratio of a flowrate of the carrier gas and a flowrate of the etchant can be as noted above. Such ratio can be used to tune desired selectivity between boron-doped non-epitaxial silicon germanium 504 and boron-doped epitaxial silicon germanium 502.

Figure 7:
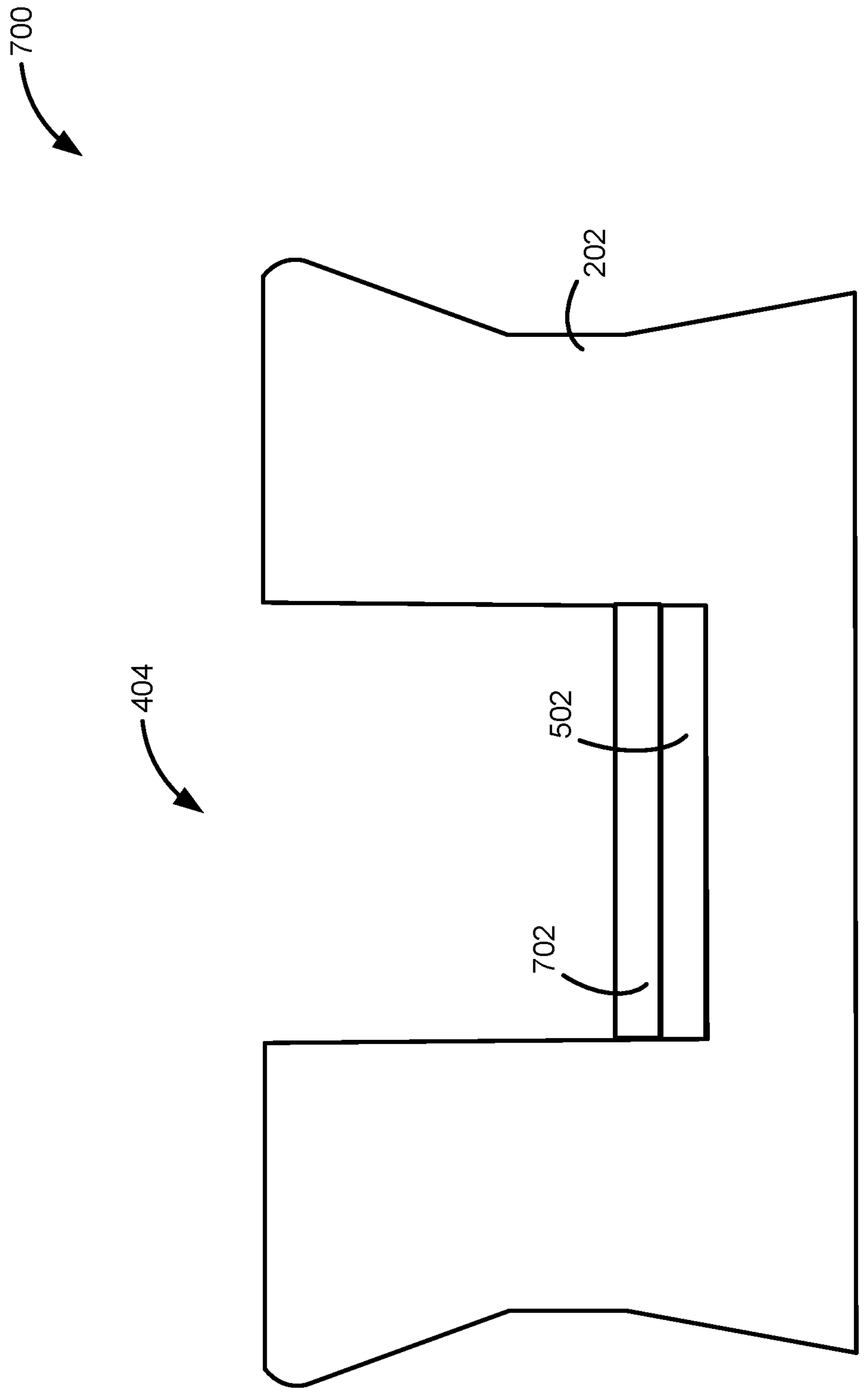

Steps 202 and 204 can be repeated (loop 206) a number of times to fill feature 404 from the bottom upwards. FIG. 7 illustrates a structure 700 after a second deposition cycle, in which a second boron-doped epitaxial silicon germanium 702 is formed overlying boron-doped epitaxial silicon germanium 502. A resistivity of boron-doped epitaxial silicon germanium 502 can be between 0.13 mOhm·cm and 0.25 mOhm·cm or between 0.15 mOhm·cm and 0.2 mOhm·cm or between about 0.19 and about 0.2 or be less than 0.2 mΩ for a thickness of, for example, about 48 nm, as measured using, for example, X ray reflectivity (XRR); high resolution X ray diffraction (HR-XRD), secondary ion mass spectroscopy (SIMS) for thickness and four point probe for sheet resistance extraction. Additionally or alternatively, boron-doped epitaxial silicon germanium 502 exhibits monocrystalline structure without relaxation.

FIG. 3 illustrates a process 300 that includes alternative steps suitable for steps 104, 106 of method 100. In the illustrated example, process 300 includes selectively forming boron-doped epitaxial silicon germanium overlying the first surface (step 302) and etching boron-doped silicon germanium overlying the second surface (step 304).

Figure 8:
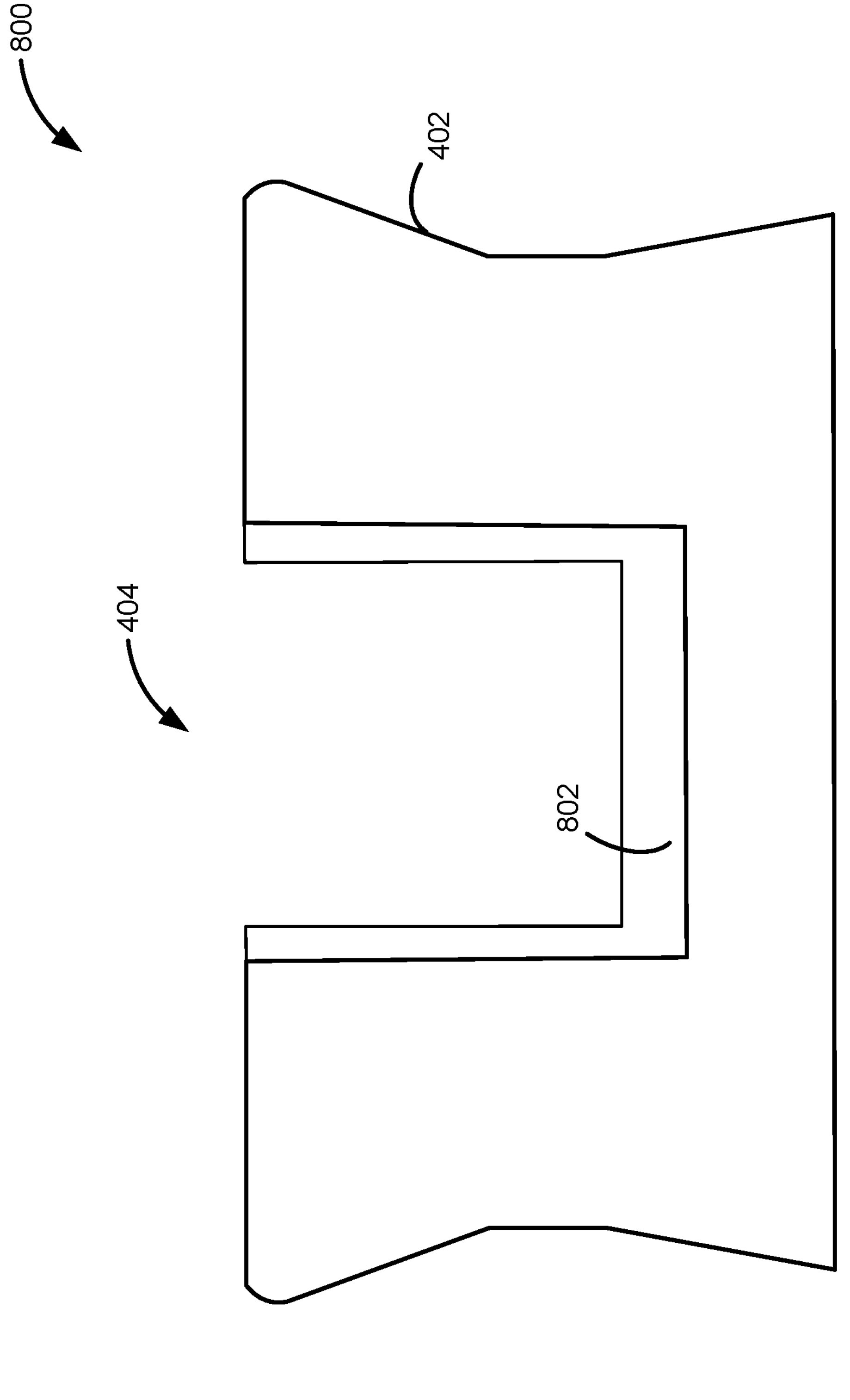

With reference to FIG. 8, during step 302, boron-doped epitaxial silicon germanium 802 may form overlying first surface 406 and second surface 408. However, because of the difference in crystal orientation of first surface 406 and second surface 408, boron-doped epitaxial silicon germanium 802 exhibits a higher deposition rate overlying first surface 406, relative to second surface 408. By way of examples, a growth rate of boron-doped epitaxial silicon germanium 802 overlying first surface 406 may be 2, 3 or 4 times higher than a growth rate of boron-doped epitaxial silicon germanium 802 overlying second surface 408.

During step 302, silicon precursors, a germanium precursor, and a boron precursor are provided to the reaction chamber. In accordance with examples of the disclosure, to facilitate desired difference in growth rate of boron-doped epitaxial silicon germanium 802 overlying first surface 406 and second surface 408, a plurality of silicon precursors are used during step 302. The silicon precursors can be selected from the group consisting of silanes (e.g., silane, disilane, and higher order silanes) and halogenated silanes (e.g., chlorinated silanes, such as dichlorosilane). By way of particular example, step 304 can include providing a first silicon precursor comprising a silane (e.g., silane or disilane) and a second silicon precursor comprising a halogenated silane (e.g., dichlorosilane) to the reaction chamber. A relative volumetric flowrate of the first silicon precursor (e.g., a silane) to the second silicon precursor (e.g., a halogenated silane) can be between about 0.05 and about 0.5 or between about 0.1 and about 0.2.

The germanium precursor and the boron precursor used during step 302 can be the same as described above. Temperatures and pressures during step 302 can be the same or similar to temperatures and pressures noted above in connection with step 202.

Figure 9:
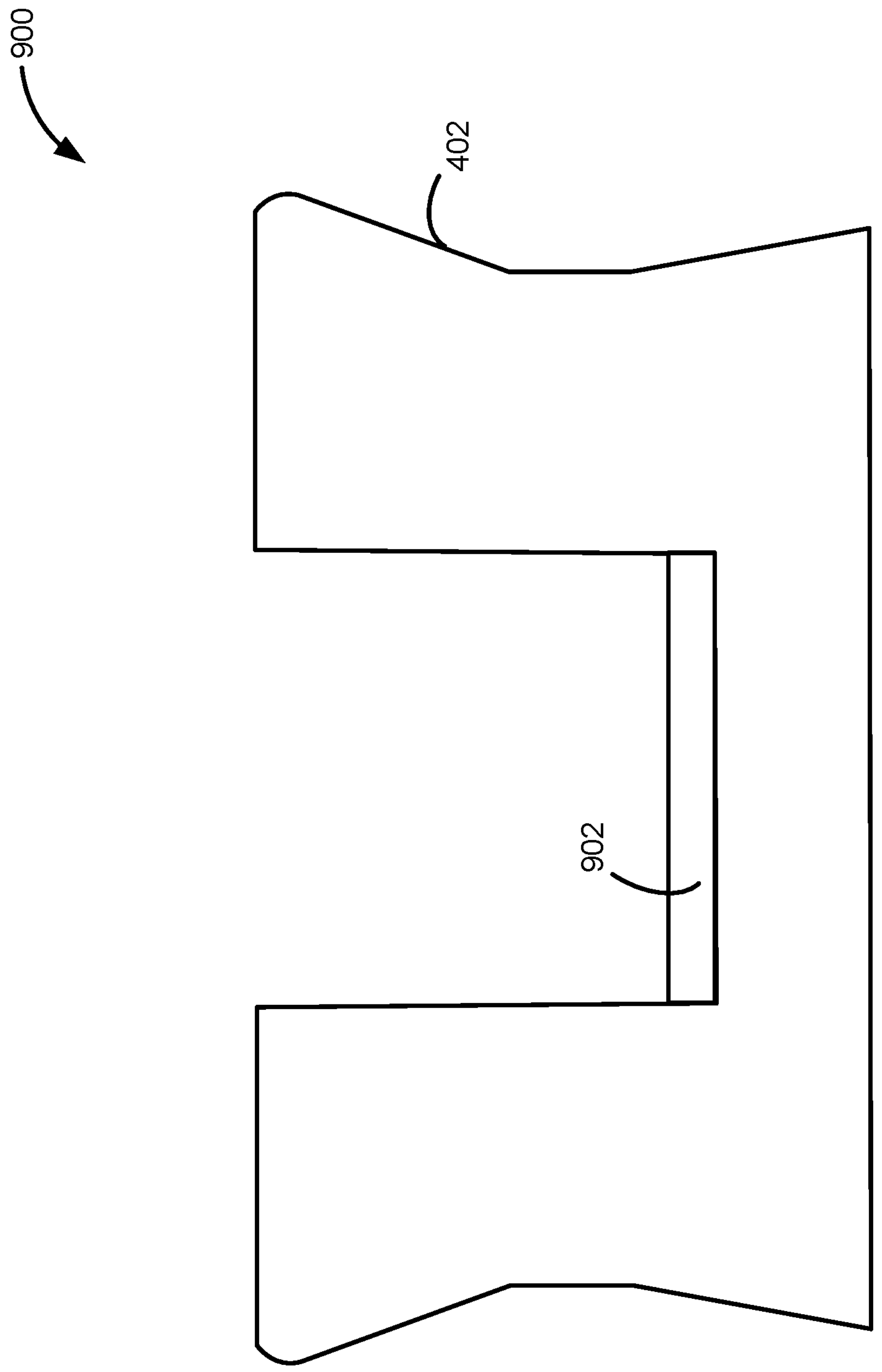

During step 304, boron-doped silicon germanium overlying the second surface 408 is removed, leaving boron-doped epitaxial silicon germanium 902 overlying first surface 406, as illustrated in FIG. 9. Step 304 can be the same or similar to step 204. Similar to above, boron-doped silicon germanium overlying second surface 408 can be removed during each deposition cycle 306 to thereby fill a gap from the bottom up. Thus, similar to process 200, process 300 can be used to fill a gap with the boron-doped epitaxial silicon germanium from a bottom of the gap upwards.

Filling features with boron-doped silicon germanium epitaxial material using a method as described herein can be used for a variety of applications. Such techniques may be particularly well suited for forming three-dimensional structures, such as structures used in the formation of a gate-all-around device. For example, structure 600 or structure 900 can be suitable for use as a source or drain region in a field effect transistor, such as a source or drain region of a gate-all-around field effect transistor.

Figure 10:
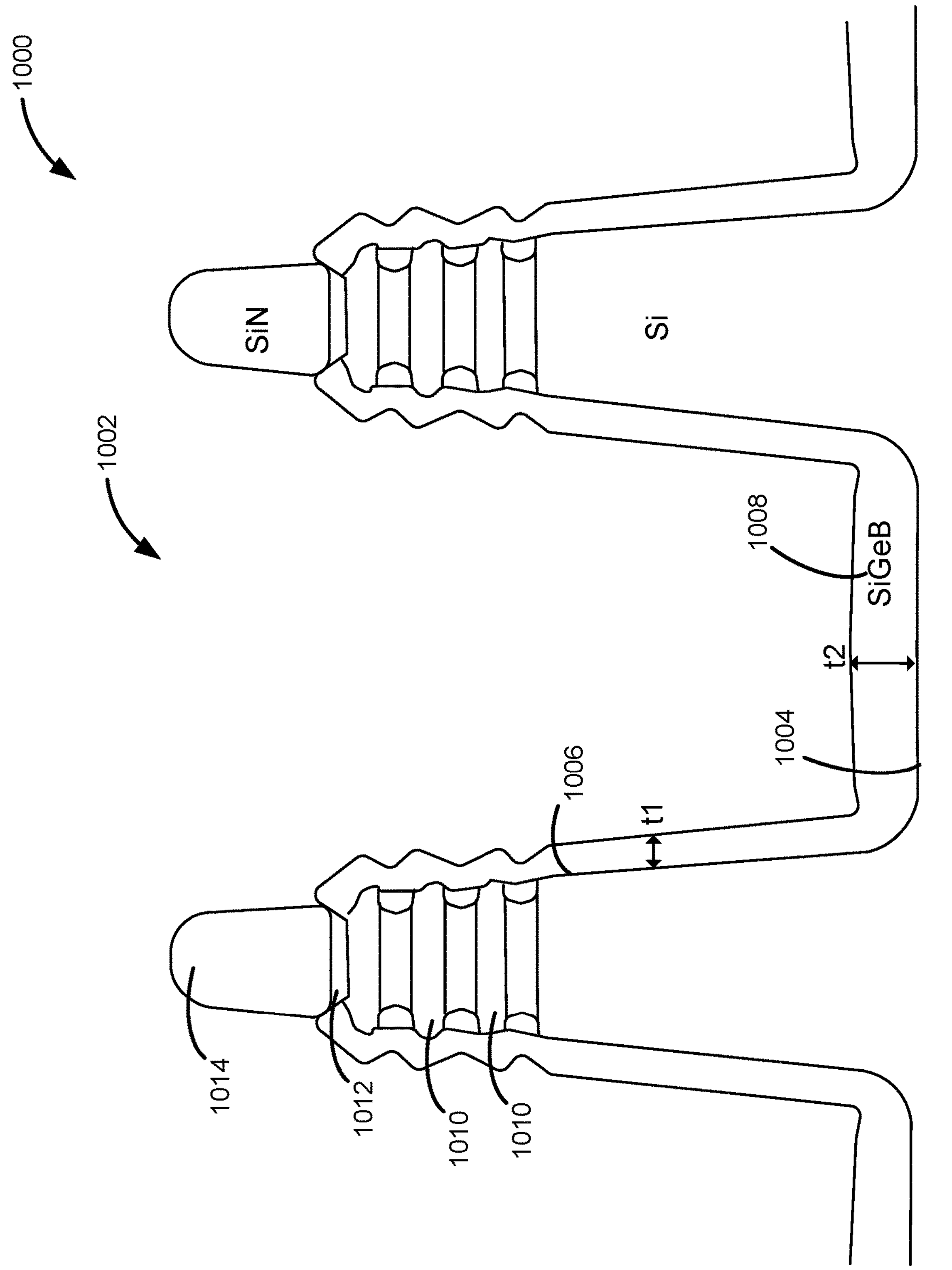
FIG. 10 illustrates a gate-all-around structure in accordance with further examples of the disclosure.

FIG. 10 illustrates a gate-all-around structure 1000 that includes a feature 1002 and boron-doped epitaxial silicon germanium 1008 overlying a first surface 1004 and a second surface 1006. In the illustrated example, a thickness t1 of boron-doped epitaxial silicon germanium 1008 overlying second surface 1006 is less than a thickness t2 of boron-doped epitaxial silicon germanium 1008 overlying first surface 1004.

As noted above, boron-doped epitaxial silicon germanium 1008 can be removed from second surface 1006, such that boron-doped epitaxial silicon germanium 1008 is formed from a bottom of feature 1002 upward. In the illustrated example, structure 1000 also includes channel regions 1010, a silicon oxide layer 1012, and a silicon nitride layer 1014. In accordance with examples of the disclosure, selectively forming boron-doped epitaxial silicon germanium overlying the first surface may be selective relative to silicon oxide and silicon nitride, such that boron-doped silicon germanium deposited on silicon oxide 1012 or silicon nitride 1014 can be easily removed during a subsequent etch, such as step 106.

Figure 11:
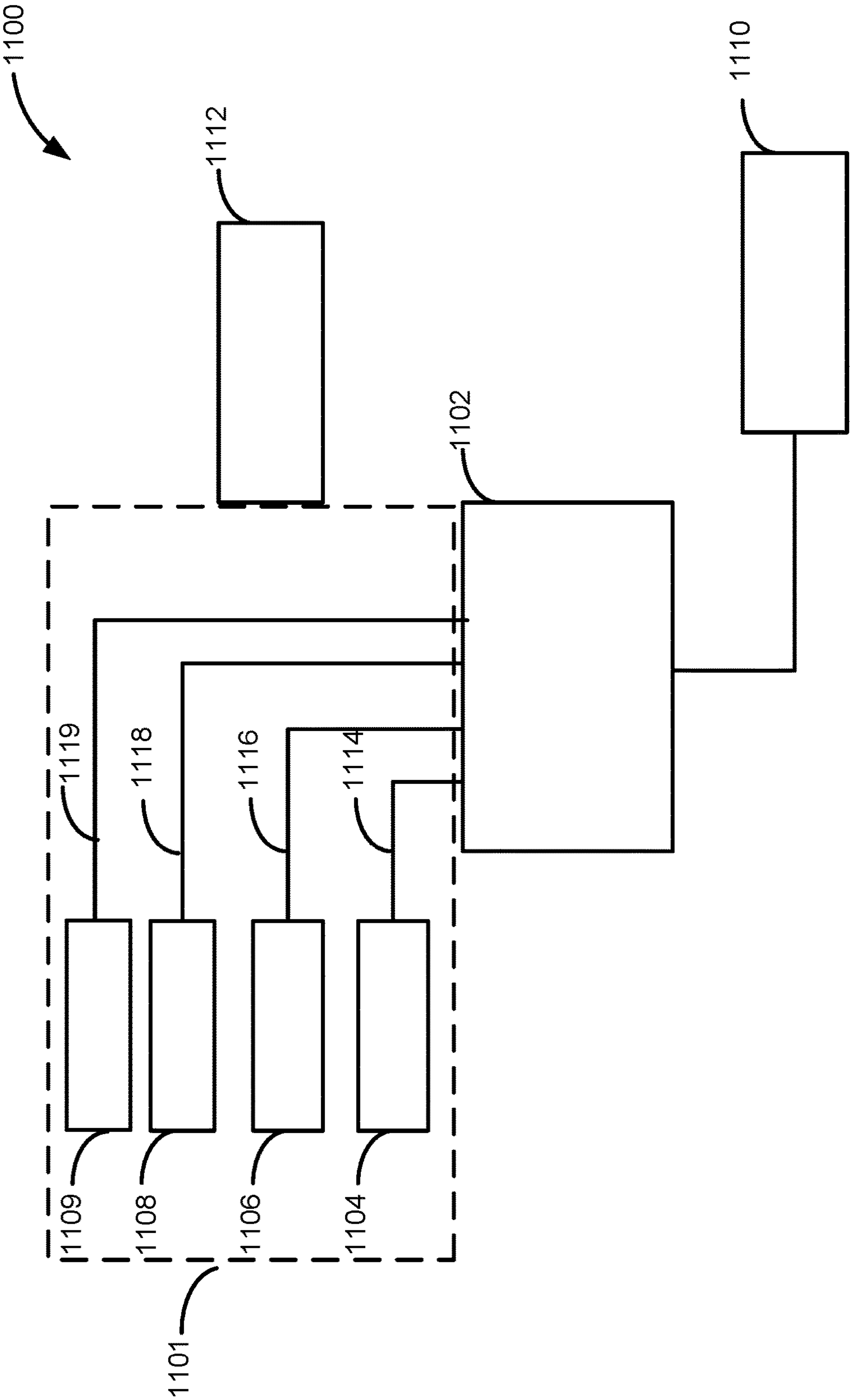
FIG. 11 illustrates a system in accordance with additional exemplary embodiments of the disclosure.

FIG. 11 illustrates a system 1100 according to examples of the current disclosure in a schematic manner. System 1100 can be used to perform a method as described herein and/or to form a structure or a device, or a portion thereof, as described herein.

In the illustrated example, system 1100 includes one or more reaction chambers 1102, a precursor injector system 1101, a first silicon precursor vessel 1104, a dopant precursor vessel 1106, an etchant vessel 1108, an exhaust source 1110, and a controller 1112. System 1100 may comprise one or more additional gas sources, such as a second silicon precursor vessel 1109, an inert gas source, a carrier gas source and/or a purge gas source. Also, in case materials comprising additional elements are deposited, the deposition assembly may further comprise additional precursor and/or dopant vessels.

Reaction chamber 1102 can include any suitable reaction chamber, such as a CVD or epitaxial reaction chamber, as described herein.

First silicon precursor vessel 1104 and/or second silicon precursor vessel 1109 can include a vessel and one or more silicon precursors, such as one or more silicon precursors as described herein—alone or mixed with one or more carrier (e.g., inert) gases. Dopant precursor vessel 1106 can include a vessel and a dopant precursor, such as a boron precursor as described herein—alone or mixed with one or more carrier gases. Similarly, etchant vessel 1108 can include a vessel and an etchant—alone or mixed with a carrier gas. Although illustrated with four source vessels 1104, 1106, 1108 and 1109, system 1100 can include any suitable number of source vessels. Source vessels 1104-1109 can be coupled to reaction chamber(s) 1102 via lines 1114, 1116, 1118 and 1119, which can each include flow controllers, valves, heaters, and the like. In some embodiments, the precursor in silicon precursor vessels 1104, 1109 and/or dopant precursor in dopant precursor vessel 1106 may be heated. In some embodiments, a temperature of the precursor vessel is regulated so that it is below about 40° C., such as between 5° C. and about 35° C. In some embodiments, a temperature of the dopant precursor vessel is regulated so that it is below 40° C., such as between 5° C. and about 35° C.

Exhaust source 1110 can include one or more vacuum pumps.

Controller 1112 includes electronic circuitry and software to selectively operate valves, manifolds, heaters, pumps and other components included in system 1100. Such circuitry and components operate to introduce precursors, etchant, other optional reactants and purge gases from the respective sources. Controller 1112 can control timing of gas pulse sequences, temperature of the substrate and/or reaction chamber 1102, pressure within reaction chamber 1102, and various other operations to provide proper operation of system 1100. Controller 1112 can include control software to electrically or pneumatically control valves to control flow of precursors, reactants and purge gases into and out of the reaction chamber(s) 1102. Controller 1112 can include modules, such as a software or hardware component, which perform certain tasks. A module may be configured to reside on the addressable storage medium of the control system and be configured to execute one or more processes. In some cases, system 1100 is configured to perform the steps of method 100 within a single reaction chamber 1102.

Other configurations of system 1100 are possible, including different numbers and kinds of precursor and reactant sources. Further, it will be appreciated that there are many arrangements of valves, conduits, precursor sources, and auxiliary reactant sources that may be used to accomplish the goal of selectively and in a coordinated manner feeding gases into reaction chamber 1102. Further, as a schematic representation of a deposition assembly, many components have been omitted for simplicity of illustration, and such components may include, for example, various valves, manifolds, purifiers, heaters, containers, vents, and/or bypasses.

During operation of system 1100, substrates, such as semiconductor wafers (not illustrated), are transferred from, e.g., a substrate handling system to reaction chamber 1102. Once substrate(s) are transferred to reaction chamber 1102, one or more gases from gas sources, such as precursors, other optional reactants and or precursors, etchant(s), carrier gases, and/or purge gases, are introduced into reaction chamber 1102.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of selectively forming crystalline boron-doped silicon germanium on a surface of a substrate, the method comprising the steps of:
- providing a substrate within a reaction chamber, the substrate comprising a first surface comprising a first crystallographic orientation, wherein the first surface consists of a Si{100} facet, and a second surface comprising a second crystallographic orientation, wherein the second surface comprises one or more of non-Si{100} crystal facets and a higher order silicon crystal facet that is perpendicularly oriented to a Si{100} crystal facet, the first surface and the second surface comprising the same material, wherein the material is a monocrystalline semiconductor material; and
- performing a cyclical deposition process to selectively form boron-doped silicon germanium epitaxial material overlying the first surface, relative to the second surface, the cyclical deposition process comprising one or more deposition cycles, each deposition cycle comprising:
  - selectively forming boron-doped epitaxial silicon germanium overlying the first surface;
  - forming boron-doped non-epitaxial silicon germanium overlying the second surface; and
  - etching boron-doped non-epitaxial silicon germanium overlying the second surface.

2. The method according to claim 1, wherein the second surface comprises one or more of a Si{110} crystal facet.

3. The method according to claim 1, wherein the substrate comprises a feature, the feature comprising a bottom comprising the first surface and a sidewall surface comprising the second surface.

4. The method according to claim 3, wherein an aspect ratio of the feature is greater than 1 or greater than 0.7 or between 0.3 and 1 or between 0.5 and 0.7.

5. The method according to claim 3, wherein the feature comprises a gap.

6. The method according to claim 1, wherein a temperature within the reaction chamber is less than 500° C. or between about 280° C. and about 450° C. or between about 350° C. and about 425° C.

7. The method according to claim 1, wherein the step of selectively forming boron-doped epitaxial silicon germanium comprises providing a silicon precursor selected from the group consisting of silane, disilane, and a halogenated silane.

8. The method according to claim 1, wherein the step of selectively forming boron-doped epitaxial silicon germanium comprises providing a first silicon precursor comprising a silane and a second silicon precursor comprising a halogenated silane to the reaction chamber.

9. The method of claim 8, wherein the halogenated silane comprises dichlorosilane.

10. The method according to claim 1, wherein the boron-doped non-epitaxial silicon germanium overlying the second surface comprises boron-doped amorphous silicon germanium.

11. The method according to claim 1, wherein a pressure within the reaction chamber during the step of selectively forming boron-doped epitaxial silicon germanium overlying the first surface is between about 10 Torr and about 90 Torr or between about 10 Torr and about 40 Torr.

12. The method according to claim 1, wherein a flowrate of a boron precursor during the step of selectively forming boron-doped epitaxial silicon germanium overlying the first surface is less than 100 sccm, less than 50 sccm or between about 15 sccm and about 25 sccm.

13. The method according to claim 1, wherein the step of etching comprises providing an etchant selected from the group consisting of chlorine ($Cl_2$) and bromine ($Br_2$).

14. The method according to claim 13, wherein the step of etching further comprises providing a carrier gas.

15. The method according to claim 14, wherein an etchant flowrate is between 10 and 200 sccm or between 20 and 50 sccm and a carrier gas flowrate is between 5 and 15 slm or about 10 slm.

16. The method according to claim 14, wherein the carrier gas is selected from the group consisting of one or more of nitrogen ($N_2$), argon (Ar), helium (He), in any combination.

17. The method according to claim 1, wherein the boron-doped non-epitaxial silicon germanium overlying the second surface is removed during each deposition cycle.

18. The method according to claim 1, comprising filling a gap with the boron-doped epitaxial silicon germanium from a bottom of the gap upwards.

19. A method of forming one or more of a source or a drain region according to the method of claim 1.

20. The method according to claim 1, wherein the monocrystalline semiconductor material is monocrystalline silicon material.

21. The method according to claim 2, wherein the higher order silicon crystal facet is Si{120}, Si{230}, Si{130}, Si{140}, Si{240}, or Si{340}.

* * * * *